United States Patent
Ishii et al.

(10) Patent No.: US 8,071,886 B2
(45) Date of Patent: Dec. 6, 2011

(54) WIRED CIRCUIT BOARD HAVING A SEMICONDUCTIVE GROUNDING LAYER AND PRODUCING METHOD THEREOF

(75) Inventors: Jun Ishii, Osaka (JP); Yasunari Ooyabu, Osaka (JP); Yasuhito Funada, Osaka (JP)

(73) Assignee: Nitto Denko Corporation, Osaka (JP)

( * ) Notice: Subject to any disclaimer, the term of this patent is extended or adjusted under 35 U.S.C. 154(b) by 1018 days.

(21) Appl. No.: 12/004,400

(22) Filed: Dec. 21, 2007

(65) Prior Publication Data

US 2008/0149361 A1    Jun. 26, 2008

Related U.S. Application Data

(60) Provisional application No. 60/907,020, filed on Mar. 16, 2007.

(30) Foreign Application Priority Data

Dec. 25, 2006 (JP) ................. 2006-347868

(51) Int. Cl.
*H05K 1/00* (2006.01)

(52) U.S. Cl. ........... 174/255; 174/254; 361/753; 29/825

(58) Field of Classification Search .......... 174/250–268, 174/68.1; 29/825; 361/748–751, 753
See application file for complete search history.

(56) References Cited

U.S. PATENT DOCUMENTS

| | | | |
|---|---|---|---|
| 2003/0151902 A1 | 8/2003 | Kageyama et al. | |
| 2005/0062020 A1 | 3/2005 | Abe | |
| 2006/0187587 A1* | 8/2006 | Arai et al. | 360/245.9 |
| 2006/0269730 A1 | 11/2006 | Ishii et al. | |

FOREIGN PATENT DOCUMENTS

| | | |
|---|---|---|
| JP | 5-331431 | 12/1993 |
| JP | 9-207259 | 8/1997 |
| JP | 11-204919 | 7/1999 |
| JP | 11-284294 | 10/1999 |
| JP | 2002-9203 | 1/2002 |
| JP | 2002-275261 | 9/2002 |
| JP | 2003-124581 | 4/2003 |
| JP | 2003-203436 | 7/2003 |
| JP | 2003-204130 | 7/2003 |
| JP | 2004-35825 | 2/2004 |
| JP | 2004-158480 | 6/2004 |
| JP | 2006-134421 | 5/2006 |
| JP | 2006-332549 | 12/2006 |

\* cited by examiner

*Primary Examiner* — Angel R Estrada
*Assistant Examiner* — Dimary Lopez
(74) *Attorney, Agent, or Firm* — Jean C. Edwards, Esq.; Edwards Neils PLLC

(57) ABSTRACT

A wired circuit board includes a metal supporting board, an insulating layer formed on the metal supporting board, a conductive pattern formed on the insulating layer and having a plurality of wires, and a semiconductive layer formed on a surface of the insulating layer exposed from the conductive pattern so as to be in contact with the conductive pattern. The insulating layer is formed with a groove exposing the metal supporting board between at least two adjacent wires, and the semiconductive layer is in contact with the metal supporting board in the groove.

7 Claims, 5 Drawing Sheets

FIG. 3
(a)
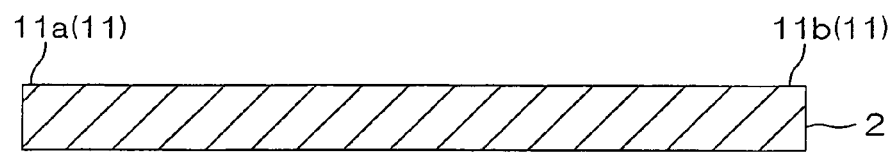
(b)
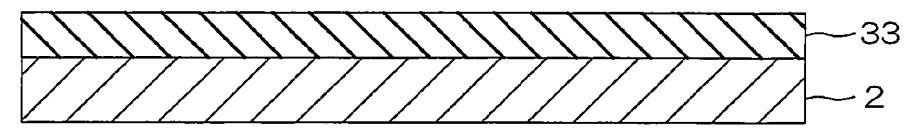
(c)
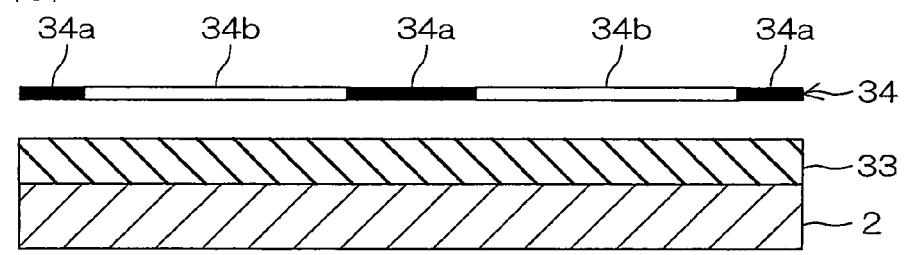
(d)
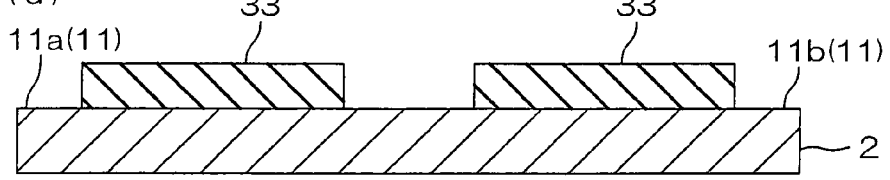
(e)
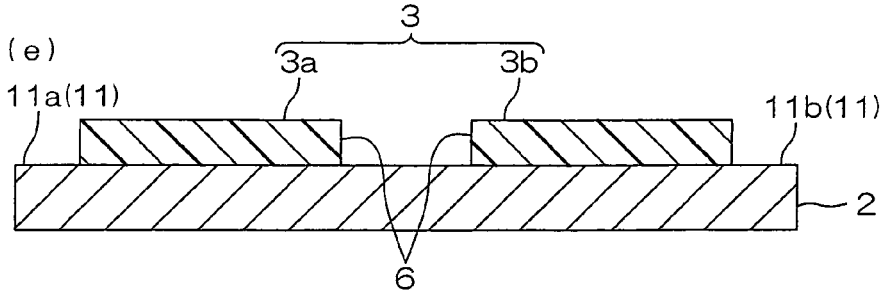

WIRED CIRCUIT BOARD HAVING A SEMICONDUCTIVE GROUNDING LAYER AND PRODUCING METHOD THEREOF

CROSS-REFERENCE TO RELATED APPLICATION

This patent application claims the benefit of U.S. Provisional Application No. 60/907,020, filed on Mar. 16, 2007, and claims priority from Japanese Patent Application No. 2006-347868, filed on Dec. 25, 2006, the contents of which are herein incorporated by reference in their entirety.

BACKGROUND OF THE INVENTION

1. Field of the Invention

The present invention relates to a wired circuit board and a producing method thereof. More particularly, the present invention relates to a wired circuit board mounted in electric and electronic equipment, and a producing method thereof.

2. Description of Related Art

A wired circuit board, such as a flexible wired circuit board or a suspension board with circuit, usually includes a base layer of polyimide, a conductive circuit of copper foil formed on the base layer, and a cover layer of polyimide formed on the base layer and the conductive circuit, and is mounted in various kinds of electric and electronic equipment while electronic components are mounted therein.

In such wired circuit board, in order to prevent electronic components mounted thereon from electrostatic breakdown, there has been known that a semiconductive layer is formed on the cover layer. There has been proposed that, for example, a conductive polymer layer is formed on the cover layer to remove static electricity charged on the cover layer via the conductive polymer layer (cf. Japanese Unexamined Patent Publication No. 2004-158480).

SUMMARY OF THE INVENTION

There also has been studied that a semiconductive layer is formed on a conductive circuit in order to prevent electrostatic breakdown of the mounted electronic components.

FIG. 6 is a sectional view in the widthwise direction orthogonal to the lengthwise direction of a suspension board with circuit. For example, as shown in the FIG. 6, in a suspension board with circuit 21 including a metal supporting board 22, an insulating base layer 23 formed on the metal supporting board 22, a conductive pattern 24 formed on the insulating base layer 23 and having a plurality of wires 27 arranged in parallel, and an insulating cover layer 25 formed on the insulating base layer 23 so as to cover the conductive pattern 24, a proposal has been considered that a semiconductive layer 30 is continuously formed on the surface of the metal supporting board 22 on both the widthwise outer sides of the insulating base layer 23, the surface of the insulating base layer 23 exposed from the conductive pattern 24, and the surface of the conductive pattern 24 along the widthwise direction, so that static electricity charged on the conductive pattern 24 can be removed via the semiconductive layer 30.

In the suspension board with circuit 21 described above, the semiconductive layer 30 is grounded on the surface of the metal supporting board 22 on both the widthwise outer sides of the insulating base layer 23. However, due to the two ground portions, when an external force acts from both the widthwise outer sides, the semiconductive layer 30 on both the widthwise outer sides of the insulating base layer 23 is then stripped off, grounding portion is not secured, resulting in difficulty of removing static electricity in some cases.

It is an object of the present invention to provide a wired circuit board capable of reliably securing a plurality of grounding portions between a semiconductive layer and a metal supporting board, and of reliably removing static electricity on a conductive pattern to prevent electrostatic breakdown of electronic components mounted on the wired circuit board, and a producing method thereof.

The wired circuit board of the present invention comprises a metal supporting board, an insulating layer formed on the metal supporting board, a conductive pattern formed on the insulating layer and having a plurality of wires, and a semiconductive layer formed on a surface of the insulating layer exposed from the conductive pattern so as to be in contact with the conductive pattern, wherein the insulating layer is formed with a groove exposing the metal supporting board between at least two adjacent wires among the wires, and the semiconductive layer is in contact with the metal supporting board in the groove.

In the wired circuit board of the present invention, it is preferable that the semiconductive layer is made of a conductive polymer.

In the wired circuit board of the present invention, it is preferable that the plurality of the wires are provided by pair on the respective insulating layers provided across the groove.

The method for producing the wired circuit board according to the present invention comprises the steps of preparing a metal supporting board and forming an insulating layer on the metal supporting board so as to form a groove exposing the metal supporting board, forming a conductive pattern having a plurality of wires provided by pair on each of the insulating layers across from the groove, and forming a semiconductive layer on each of the insulating layers exposed from the conductive pattern so as to be in contact with the metal supporting board in the conductive pattern and the groove.

In the method for producing the wired circuit board according to the present invention, it is preferable that the semiconductive layer is formed of a conductive polymer in the step of forming the semiconductive layer.

According to the wired circuit board of the present invention, the semiconductive layer can be in contact with the metal supporting board in the groove formed between at least two wires, and also in contact with the metal supporting board on the outer sides of at least two insulating layers sandwiching the groove. This allows the semiconductive layer to reliably secure a plurality of grounding portions on the metal supporting board. Such grounding at the plurality of portions can provide stable charge attenuation performance, thereby allowing to reliably and stably remove static electricity charged on the conductive pattern. As a result, the electrostatic breakdown of the electronic components mounted on the wired circuit board can be prevented, thereby improving the connection reliability of the wired circuit board.

Further, according to the method for producing the wired circuit board of the present invention, the semiconductive layer is formed so as to be in contact with the metal supporting board in the groove and the conductive pattern, and can also be formed so as to be in contact with the metal supporting board on the outer sides of the insulating layer sandwiching the groove. This allows the semiconductive layer to reliably secure a plurality of grounding portions on the metal supporting board. Such grounding at the plurality of portions can provide stable charge attenuation performance, thereby allowing to reliably and stably remove static electricity charged on the conductive pattern. As a result, the electrostatic breakdown of the electronic components mounted on the wired circuit board obtained by the producing method can be prevented, thereby improving the connection reliability of the wired circuit board.

BRIEF DESCRIPTION OF THE DRAWINGS

FIG. 3 is a process diagram illustrating the steps of producing the suspension board with circuit shown in FIG. 2,
  (a) showing the step of preparing a metal supporting board,
  (b) showing the step of forming a base coating on the metal supporting board,
  (c) showing the step of exposing the base coating to light through a photomask,
  (d) showing the step of removing an unexposed portion of the base coating by development, and
  (e) showing the step of curing the base coating to form an insulating base layer;

DETAILED DESCRIPTION OF THE INVENTION

Figure 1:
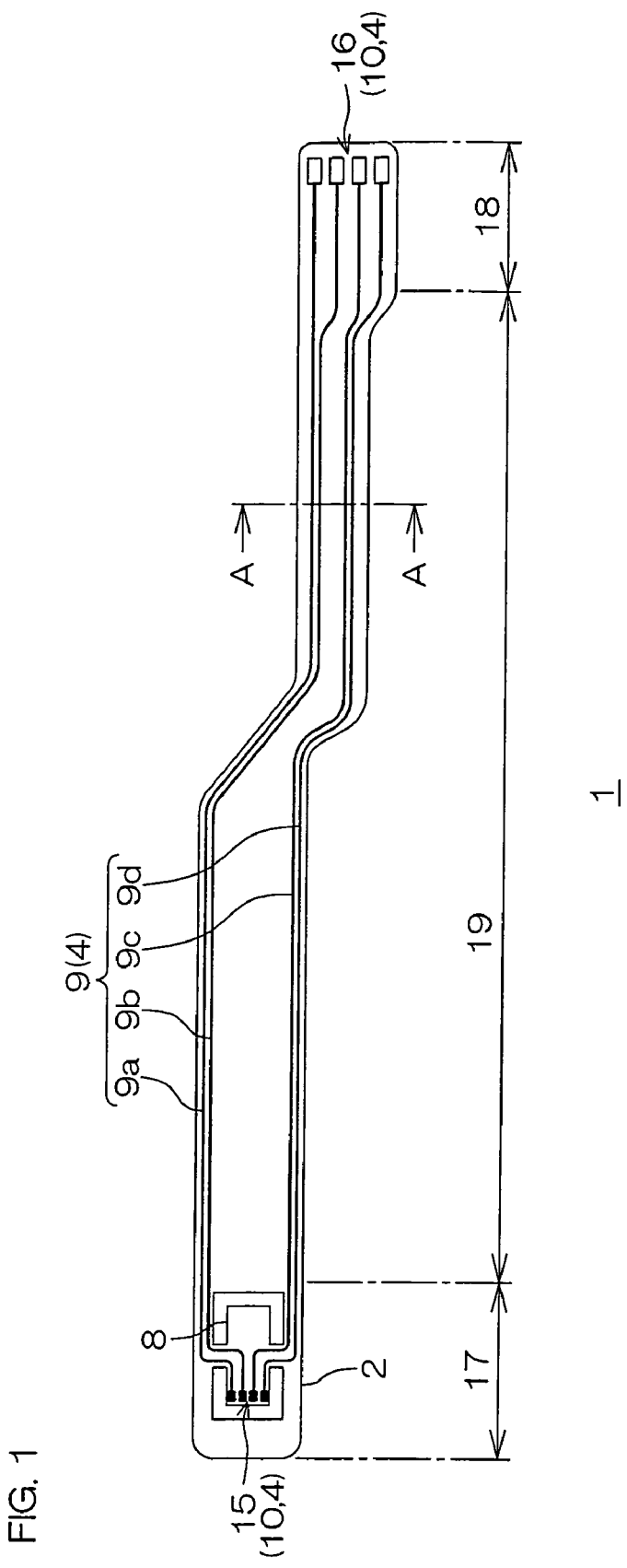
FIG. 1 is a schematic plan view illustrating a suspension board with circuit as an embodiment of a wired circuit board according to the present invention.
Figure 2:
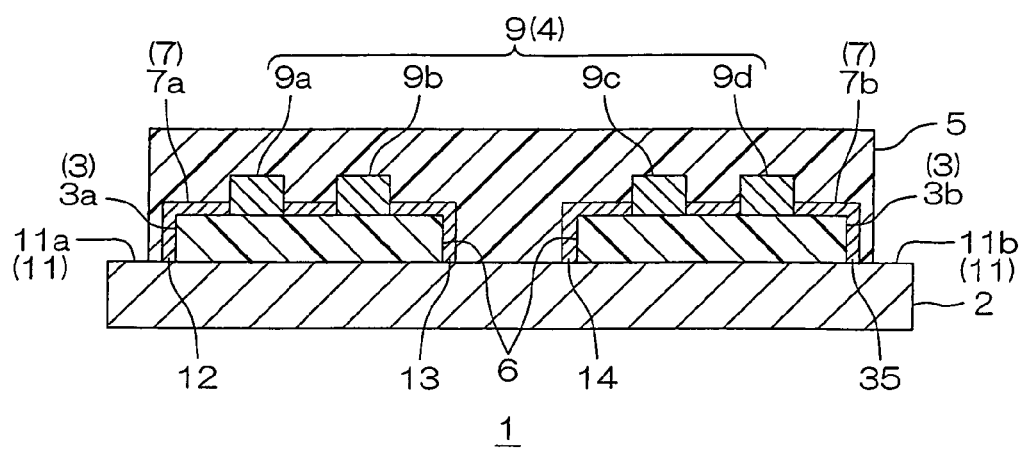
FIG. 2 is a sectional view taken along the line A-A in FIG. 1.

FIG. 1 is a schematic plan view illustrating a suspension board with circuit as an embodiment of a wired circuit board according to the present invention, and FIG. 2 is a sectional view taken along the line A-A in FIG. 1. To clarify a relative position of a conductive pattern 4 to a metal supporting board 2, an insulating base layer 3, a semiconductive layer 7, and an insulating cover layer 5, which are mentioned later, are omitted in FIG. 1.

In FIG. 1, a suspension board with circuit 1 is mounted on a hard disk drive. In the suspension board with circuit 1, the conductive pattern 4 for connecting a magnetic head (not shown) and a read/write board (not shown) is integrally formed on the metal supporting board 2. The metal supporting board 2 supports the magnetic head mounted thereon, while holding a minute gap between the magnetic head and a magnetic disk (not shown) against an airflow caused when the magnetic head and the magnetic disk travel relatively to each other.

The conductive pattern 4 integrally includes magnetic-head-side connecting terminals 15 for connecting with connecting terminals of a magnetic head, external connecting terminals 16 for connecting with connecting terminals of the read/write board, and a plurality of wires 9 for connecting the magnetic-head-side connecting terminals 15 and the external connecting terminals 16 (hereinafter simply referred to collectively as "terminal portion 10"), all mentioned later.

The suspension board with circuit 1 is formed so as to extend in a lengthwise direction, and integrally includes a magnetic-head-side connecting terminal forming region 17, an external connecting terminal forming region 18, and a wire forming region 19 arranged therebetween.

The magnetic-head-side connecting terminal forming region 17 is arranged in lengthwise one end portion (hereinafter referred to as the front end portion) of the suspension board with circuit 1, and is formed in a generally rectangular shape in plane view. Further, in the magnetic-head-side connecting terminal forming region 17, the magnetic-head-side connecting terminals 15 that are continuous from the front end portions of the plurality of the wires 9 and are arranged in parallel as a broad land with respect to a widthwise direction (a direction orthogonal to the lengthwise direction; the same applies hereinafter), and a gimbal 8 for mounting the magnetic head is provided that is formed by cutting out the metal supporting board 2 so as to sandwich the magnetic-head-side connecting terminals 15.

The external connecting terminal forming region 18 is arranged in the lengthwise other end portion (hereinafter referred to as the rear end portion) of the suspension board with circuit 1, and is formed in a generally rectangular shape in plane view. Further, in the external connecting terminal forming region 18, the external connecting terminals 16 are provided that are continuous from the rear end portions of the plurality of the wires 9 and are arranged in parallel as a broad land with respect to a widthwise direction.

The wire forming region 19 is arranged between the magnetic-head-side connecting terminal forming region 17 and the external connecting terminal forming region 18 over the lengthwise direction of the suspension board with circuit 1 so as to be continuous therewith, and is formed in a generally rectangular flat band in plane view. Further, in the wire forming region 19, the plurality of the wires 9 extending along the lengthwise direction are arranged in parallel spaced relation to each other in the widthwise direction.

The plurality of the wires 9 are formed with one pair of wires 9a and 9b arranged in parallel on widthwise one side, and the other pair of wires 9c and 9d arranged in parallel on the widthwise other side. Of the wires 9a and 9b of one pair, one wire 9a is arranged on the widthwise outer side while the other wire 9b is arranged on the widthwise inner side. Further, of the wires 9c and 9d of the other pair, one wire 9c is arranged on the widthwise inner side while the other wire 9d is arranged on the widthwise outer side.

The one pair of the wires 9a and 9b, and the other pair of the wires 9c and 9d are spaced apart in the widthwise direction.

Each of the plurality of wires 9 is either a read wire for reading data from the magnetic disk, or a write wire for writing data into the magnetic disk. The combination of the wires is selected from any of the combinations, for example, in which the wires 9a and 9b of one pair are both read wires while the wires 9c and 9d of the other pair are both write wires, the wires 9a and 9b of one pair are both write wires while the wires 9c and 9d of the other pair are both read wires, one is a read wire and the other is a write wire in the wires 9a and 9b of one pair or vice versa, or, one is a read wire and the other is a write wire in the wires 9c and 9d of the other pair, or vice versa.

As shown in FIG. 2, in the wire forming region 19, the suspension board with circuit 1 includes the metal supporting board 2, the insulating base layer 3 formed on the metal supporting board 2 as an insulating layer, the conductive pattern 4 formed on the insulating base layer 3, the semiconductive layer 7 formed on a surface of the insulating base layer 3 exposed from the conductive pattern 4, and the insulating cover layer 5 formed on the metal supporting board 2, the semiconductive layer 7, and the conductive pattern 4.

Further, although not shown, the suspension board with circuit 1 includes, in the magnetic-head-side connecting terminal forming region 17 and the external connecting terminal forming region 18, the metal supporting board 2, the insulating base layer 3 formed on the metal supporting board 2, the conductive pattern 4 formed on the insulating base layer 3 so as to be integrally formed with the wires 9 and the terminal portion 10, and the insulating cover layer 5 formed on the insulating base layer 3 so as to cover the wires 9 and open the terminal portion 10.

The metal supporting board 2 is formed of a flat thin plate extending in the lengthwise direction corresponding to the outer shape of the suspension board with circuit 1 described above.

The metal supporting board 2 has a width in the range of, usually, 0.2 to 2.0 mm, and a width in the wire forming region 19 in the range of, for example, 0.43 to 1.28 mm, or preferably 0.5 to 1.0 mm. The metal supporting board 2 has a thickness in the range of, for example, 10 to 50 μm, or preferably 18 to 25 μm.

The insulating base layer 3 is formed on the metal supporting board 2 as a pattern corresponding to a portion where the conductive pattern 4 is formed. In the wire forming region 19, the insulating base layer 3 includes a first insulating base layer 3a corresponding to one pair of the wires 9a and 9b, and a second insulating base layer 3b corresponding to the other pair of the wires 9c and 9d. That is, the first insulating base layer 3a and the second insulating base layer 3b are spaced apart from each other in the widthwise direction, and the first insulating base layer 3a is arranged on widthwise one side while the second insulating base layer 3b is arranged on the widthwise other side so as to be opposed to the first insulating base layer 3a in the widthwise direction.

Thus, the insulating base layer 3 in the wire forming region 19 is formed with a groove 6 between the first insulating base layer 3a and the second insulating base layer 3b so as to expose some widthwise midpoint in the metal supporting board 2. The insulating base layer 3 in the wire forming region 19 also exposes widthwise both end portions 11 of the metal supporting board 2, more specifically, the upper surfaces of widthwise one end portion 11a and the widthwise other end portion 11b of the metal supporting board 2.

In the wire forming region 19, the first insulating base layer 3a of the insulating base layer 3 has a width in the range of, for example, 100 to 1000 μm, or preferably 210 to 630 μm, and the second insulating base layer 3b of the insulating base layer 3 has a width in the range of, for example, 100 to 1000 μg/m, or preferably 210 to 630 μm. Further, the groove 6 has a width in the range of, for example, 30 to 500 μm, preferably 30 to 200 μm, or more preferably 30 to 70 μm. The insulating base layer 3 has a thickness in the range of, for example, 1 to 35 μm, or preferably 5 to 12 μm.

The conductive pattern 4 is formed as a wired circuit pattern integrally including the plurality of the wires 9 arranged in parallel spaced relation to each other in the widthwise direction as described above, and the terminal portions 10 (cf. FIG. 1) each connected to the front end portion and the rear end portion of the respective wires 9.

In the conductive pattern 4 in the wire forming region 19, one pair of the wires 9a and 9b and the other pair of the wires 9c and 9d are provided by pair on the first insulating base layer 3a and the second insulating base layer 3b provided across the groove 6, respectively. A metal plating layer, which is not shown, is formed on the surface of each of the terminal portions 10 as required.

In the conductive pattern 4, each of the wires 9 has a width in the range of, for example, 10 to 200 μm, or preferably 20 to 70 μm.

Each of the spacing between the wires 9a and 9b of one pair and the spacing between the wires 9c and 9d of the other pair is in the range of, for example, 10 to 200 μm, or preferably 20 to 40 μm. Further, the spacing between the widthwise inner side wire 9b in the wires 9a and 9b of one pair, and the widthwise inner side wire 9c in the wires 9c and 9d of the other pair, is in the range of, for example, 50 to 540 μm, or preferably 70 to 240 μm.

The conductive pattern 4 has a thickness in the range of, for example, 3 to 20 μm, or preferably 3 to 17 μm.

The semiconductive layer 7 in the wire forming region 19 is formed so as to cover the insulating base layer 3 exposed from the conductive pattern 4. More specifically, the semiconductive layer 7 is formed on the surface of the insulating base layer 3 that is exposed from the conductive pattern 4 and covered with the insulating cover layer 5. That is, the semiconductive layer 7 is formed so as to be interposed between the insulating base layer 3 and the insulating cover layer 5.

The semiconductive layer 7 includes a first semiconductive layer 7a and a second semiconductive layer 7b corresponding to the first insulating base layer 3a and the second insulating base layer 3b of the insulating base layer 3, respectively.

The first semiconductive layer 7a is formed on the surface of the first insulating base layer 3a exposed from the wires 9a and 9b of one pair. More specifically, the first semiconductive layer 7a is formed on the upper surface and both the widthwise side surfaces of the first insulating base layer 3a exposed from the wires 9a and 9b of one pair so as to be in contact with each of both the widthwise side surfaces of the wires 9a and 9b of one pair. Further, the first semiconductive layer 7a is formed on the upper surface of the metal supporting board 2 exposed from the first insulating base layer 3a. More specifically, the first semiconductive layer 7a is formed on widthwise one side surface of the first insulating base layer 3a while a portion laminated on an upper surface of widthwise one end portion 11a of the metal supporting board 2 is defined as a first lower end portion 12. The first semiconductive layer 7a is also formed on the widthwise other side surface of the first insulating base layer 3a while a portion laminated on an upper surface of the widthwise one end portion of the metal supporting board 2 in the groove 6 is defined as a second lower end portion 13.

The second semiconductive layer 7b is formed on the surface of the second insulating base layer 3b exposed from the wires 9c and 9d of the other pair. More specifically, the second semiconductive layer 7b is formed on the upper surface and both the widthwise side surfaces of the second insulating base layer 3b exposed from the wires 9c and 9d of the other pair so as to be in contact with each of both the widthwise side surfaces of the wires 9c and 9d of the other pair. Further, the second semiconductive layer 7b is formed on the upper surface of the metal supporting board 2 exposed from the second insulating base layer 3b. More specifically, the second semiconductive layer 7b is formed on widthwise one side surface of the second insulating base layer 3b while a portion laminated on an upper surface of the widthwise other end portion of the metal supporting board 2 in the groove 6 is defined as a third lower end portion 14. The second semiconductive layer 7b is also formed on widthwise the other side surface of the second insulating base layer 3b while a portion laminated on an upper surface of the widthwise other end portion 11b of the metal supporting board 2 is defined as a fourth lower end portion 35.

Thus, the first semiconductive layer 7a is in contact with the first insulating base layer 3a on the lower side in the thickness direction, and in contact with the insulating cover layer 5 on the upper side in the thickness direction. Further, the first semiconductive layer 7a is in contact with the wires 9a and 9b of one pair in the widthwise direction, and the first and the second lower end portions 12 and 13 are in contact with the metal supporting board 2 on the lower side in the thickness direction.

On the other hand, the second semiconductive layer 7b is in contact with the second insulating base layer 3b on the lower side in the thickness direction, and in contact with the insulating cover layer 5 on the upper side in the thickness direction. Further, the second semiconductive layer 7b is in contact with the wires 9c and 9d of the other pair in the widthwise direction, and the third and the fourth lower end portions 14 and 35 are in contact with the metal supporting board 2 on the lower side in the thickness direction.

In short, each semiconductive layer 7 is in contact with the metal supporting board 2, each of the insulating base layers 3, the conductive pattern 4, and the insulating cover layer 5.

Each of the semiconductive layers 7 has a thickness in the range of, for example, 5 to 50 nm, or preferably 10 to 40 nm.

The insulating cover layer 5 in the wire forming region 19 is formed as a pattern on the metal supporting board 2 exposed from the semiconductive layer 7, the conductive pattern 4, and the semiconductive layer 7. More specifically, the insulating cover layer 5 in the widthwise direction of the wire forming region 19 is continuously formed so as to cover the first semiconductive layer 7a formed on both the widthwise side surfaces of the first insulating base layer 3a, so as to cover the second semiconductive layer 7b formed on both the widthwise side surfaces of the second insulating base layer 3b, and so as to cover the upper surface of the metal supporting board 2 between the first semiconductive layer 7a and the second semiconductive layer 7b. The insulating cover layer 5 in the widthwise direction of the wire forming region 19 is also formed so as to expose the upper surfaces of both end edges of both the widthwise end portions 11 (widthwise one end portion 11a and the widthwise other end portion 11b) of the metal supporting board 2.

Although not shown, the insulating cover layer 5 in the magnetic-head-side connecting terminal forming region 17 and the external connecting terminal forming region 18 is formed as a pattern on the insulating base layer 3 so as to cover the wires 9 and open the terminal portion 10.

The insulating cover layer 5 in the wire forming region 19 has a width in the range of, for example, 0.15 to 1.95 mm, or preferably 0.38 to 1.23 mm. The insulating cover layer 5 has a thickness in the range of, for example, 1 to 40 μm, or preferably 1 to 7 μm.

Figure 4:
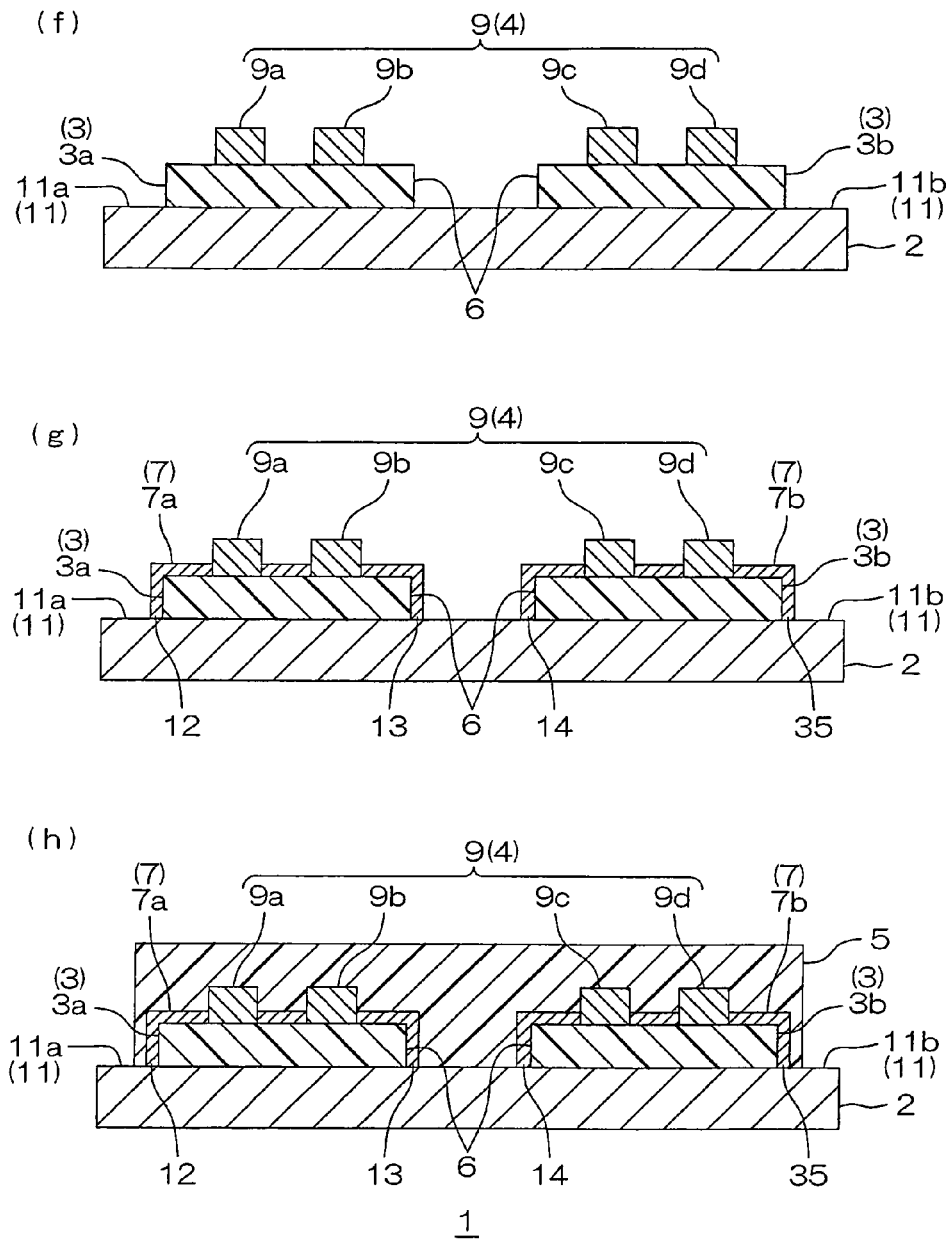
FIG. 4 is a process diagram illustrating the steps of producing the suspension board with circuit shown in FIG. 2, subsequent to FIG. 3,
  (f) showing the step of forming a conductive pattern on the insulating base layer,
  (g) showing the step of forming a semiconductive layer on the surface of the insulating base layer exposed from the conductive pattern so as to be in contact with the conductive pattern and the metal supporting board, and
  (h) showing the step of forming an insulating cover layer on the metal supporting board exposed from the semiconductive layer, on the conductive pattern, and on the semiconductive layer in a wire forming region.

FIGS. 3 and 4 are process diagrams illustrating the steps of producing the suspension board with circuit shown in FIG. 2.

Next, a method for producing the suspension board with circuit 1 is described with reference to FIGS. 3 and 4.

In this method, a metal supporting board 2 is first prepared, as shown in FIG. 3(a).

The metal that may be used to form the metal supporting board 2 includes, for example, a foil of metal, such as stainless steel, 42-alloy, aluminum, copper-beryllium, or phosphor bronze. Preferably, a stainless steel foil is used.

Then, in this method, the insulating base layer 3 is formed on the metal supporting board 2 in a pattern corresponding to a portion where the conductive pattern 4 is formed and formed with the groove 6 shown in FIGS. 3(b) to 3(e).

The insulator that may be used to form the insulating base layer 3 includes, for example, synthetic resin such as polyimide, acrylic, polyether nitrile, polyether sulfone, polyethylene terephthalate, polyethylene naphthalate, polyvinyl chloride, or the like. Of these, preferably a photosensitive synthetic resin, or more preferably, photosensitive polyimide is used in order to form the insulating base layer 3 in a pattern.

For a portion where the insulating base layer 3 is formed from photosensitive polyimide, for example, as shown in FIG. 3(b), a varnish of polyimide precursor containing a photosensitizer (hereinafter referred to as photosensitive polyamic acid resin) is first prepared. The varnish is uniformly coated over the surface of the metal supporting board 2, for example, by a known coating method, such as roll coating, gravure coating, spin coating, or bar coating, and the coated varnish is dried to form a base coating 33.

Then, as shown in FIG. 3(c), the base coating 33 is exposed to light through a photomask 34. In the case of patterning the base coating 33 with a negative image, the exposure is performed while the photomask 34 is arranged so that a light-shielded portion 34a is opposed to a portion where the insulating base layer 3 is not formed, and a light-transmitted portion 34b is opposed to a portion where the insulating base layer 3 is formed.

Subsequently, the base coating 33 is heated at a given temperature in order to form a negative image as required. Thereafter, as shown in FIG. 3(d), an unexposed portion to which the light-shielded portion 34a in the base coating 33 is opposed is removed by development. The development is performed by a dipping or spraying method, for example, using an alkaline developer or the like as a developer. Thus, the base coating 33 is formed in the above-mentioned pattern.

In the case of patterning the base coating 33 with a positive image, although not shown, a process reverse to the above is performed. That is, the exposure is performed while the photomask 34 is arranged so that the light-transmitted portion 34b is opposed to the portion where the insulating base layer 3 is not formed, and the light-shielded portion 34a is opposed to the portion where the insulating base layer 3 is formed. Subsequently, the base coating 33 is heated at a given temperature in order to form a positive image as required, and is then developed.

Thereafter, as shown in FIG. 3(e), for example, the base coating 33 is heated at 250° C. or higher under reduced pressure to be cured (imidized). Thus, the insulating base layer 3 is formed.

Accordingly, the insulating base layer 3 is formed on the metal supporting board 2 in a pattern corresponding to a portion where the conductive pattern 4 is formed and formed with the groove 6.

Then, in this method, as shown in FIG. 4(f), the conductive pattern 4 is formed on the insulating base layer 3.

The conductor that may be used to form the conductive pattern 4 includes, for example, a metal foil such as copper, nickel, gold, solder, or alloys thereof, or preferably a copper foil is used from a viewpoint of conductivity, low cost, and processability.

The conductive pattern 4 is formed on the surface of the insulating base layer 3 as a wired circuit pattern where the terminal portion 10 and the wires 9 both described above are integrally formed by a known patterning method, such as a subtractive method or an additive method.

In the subtractive method, a conductor is first laminated on the entire surface of the insulating base layer 3 via an adhesive layer as required. Then, an etching resist having the same pattern as the wired circuit pattern is formed on the conductor. Subsequently, the conductor is etched using the etching resist as a resist to form the conductive pattern 4, and thereafter, the etching resist is removed.

In the additive method, a seed layer made of a thin conductive film is first formed on the entire surface of the insulating base layer 3. Then, after a plating resist is formed in a pattern reverse to the wired circuit pattern on the surface of the seed layer, the conductive pattern 4 is formed as the wired circuit pattern on the surface of the seed layer exposed from the plating resist by electrolytic plating. Thereafter, the plating resist and the seed layer on a portion of which the plating resist is laminated are removed.

Then, in this method, as shown in FIG. 4(g), the semiconductive layer 7 is formed on the surface of the insulating base layer 3 exposed from the conductive pattern 4 so as to be in contact with the conductive pattern 4 and the metal supporting board 2 (both widthwise end portions 11a and 11b of the metal supporting board 2, and both widthwise end portions in the groove 6).

For example, resin or metal is used as a semiconductive material for forming the semiconductive layer 7.

The resin that may be used includes, for example, a conductive polymer such as a semiconductive resin composition in which conductive particles are dispersed.

Of these semiconductive materials for forming the semiconductive layer 7, a conductive polymer is preferably used.

The conductive polymer that may be used includes, for example, polyaniline, polypyrrole, and polythiophene, or a derivative thereof, or preferably polyaniline is used. These conductive polymers can be used alone or in combination of two or more kinds.

The metal that may be used includes, for example, a metal oxide. The metal oxide that may be used includes, for example, chromium oxide, nickel oxide, copper oxide, titanium oxide, zirconium oxide, indium oxide, aluminum oxide, and zinc oxide, or chromium oxide is preferably used. These metals can be used alone or in combination of two or more kinds.

The semiconductive layer 7 can be formed from the conductive polymer, for example, by a method of dipping the suspension board with circuit 1 in a polymeric liquid of a conductive polymer to polymerize and deposit the polymer, a method of applying a solution of a conductive polymer to the suspension board with circuit 1 and drying a solvent thereof, or the like.

In the method of dipping the suspension board with circuit 1 in a polymeric liquid of a conductive polymer to polymerize and deposit the polymer, for example, the suspension board with circuit 1 in a production process shown in FIG. 4(f) is first dipped in the polymeric liquid of the conductive polymer, and a polymerization initiator is mixed with the polymeric liquid.

The polymeric liquid of the conductive polymer is prepared, for example, by mixing a monomer and a solvent for polymerizing the conductive polymer.

The monomer that may be used includes, for example, aniline, pyrrole, and thiophene, or preferably aniline is used. These monomers can be used alone or in combination of two or more kinds.

The solvent that may be used includes, for example, water, and an acidic aqueous solution, or preferably an acidic aqueous solution is used. An acidic component that may be used to form the acidic aqueous solution includes, for example, an inorganic acid such as hydrochloric acid, nitric acid, sulfuric acid, or phosphoric acid, and an organic acid such as formic acid, acetic acid, or oxalic acid. These solvents can be used alone or in combination of two or more kinds.

The polymerization initiator that may be used includes, for example, an azo initiator such as 2,2'-azobisisobutyronitril, 2,2'-azobis(2-methylpropioneamidine) disulfate, or 2,2'-azobis(2-methylpropioneamidine) dihydrochloride, a persulfate initiator such as potassium persulfate (potassium peroxodisulfate) or ammonium persulfate (ammonium peroxodisulfate), a peroxide initiator such as benzoyl peroxide, t-butyl hydroperoxide, or hydrogen peroxide, a substituted ethane initiator such as phenyl substituted ethane, a carbonyl initiator such as an aromatic carbonyl compound, and a redox initiator such as a combination of persulfate and sodium hydrogensulfite or a combination of peroxide and sodium ascorbate. These polymerization initiators can be used alone or in combination of two or more kinds.

To mix the polymerization initiator with the polymeric liquid of the conductive polymer, a polymerization initiator solution obtained by dissolving a polymerization initiator in a solvent is prepared as required, and the polymerization initiator solution can also be mixed. As the solvent used for preparation of the polymerization initiator solution, the same solvent as that used for preparation of the polymeric liquid is used.

The concentration of monomers in the polymeric liquid of the conductive polymer is in the range of, for example, 0.005 to 0.5 mol/L, or preferably 0.01 to 0.1 mol/L. In the case where the solvent is an acidic aqueous solution, the concentration of acidic components is in the range of, for example, 0.002 to 0.1 mol/L, or preferably 0.005 to 0.05 mol/L. Further, when the polymerization initiator (or polymerization initiator solution) is mixed with the polymeric liquid, the concentration of the polymerization initiator in the polymeric liquid is in the range of, for example, 0.002 to 0.2 mol/L, or preferably 0.005 to 0.1 mol/L.

Then, the above-mentioned suspension board with circuit 1 is dipped in the polymeric liquid of the conductive polymer and mixed with the polymerization initiator. Thereafter, the suspension board with circuit 1 is dipped therein, for example, for 5 to 180 minutes, or preferably for 10 to 100 minutes. In such dipping, the dipping temperature of the polymeric liquid of the conductive polymer is set in the range of, for example, 1 to 40° C., or preferably 5 to 25° C.

Accordingly, the semiconductive layer 7 made of the conductive polymer is formed by polymerization so as to be deposited on the surface of the insulating base layer 3 exposed from the conductive pattern 4.

Thereafter, the suspension board with circuit 1 in a production process formed with the semiconductive layer 7 is washed with water.

Subsequently, in this method, the conductive polymer of the semiconductive layer 7 is doped as required.

To dope the conductive polymer of the semiconductive layer 7, the suspension board with circuit 1 formed with the above-mentioned semiconductive layer 7 is dipped in a solution in which a doping agent is dissolved (a doping agent solution).

The doping agent imparts conductivity to the conductive polymer, and the doping agent that may be used includes, for example, p-toluenesulfonic acid, dodecylbenzenesulfonic acid, alkylnaphthalenesulfonic acid, polystyrenesulfonic acid, p-toluenesulfonic acid novolac resin, p-phenolsulfonic acid novolac resin, and β-naphthalenesulfonic acid-formalin condensate. These doping agents can be used alone or in combination of two or more kinds.

For example, water or methanol is used as a solvent for dissolving the doping agent.

In preparation of the doping agent solution, the solvent is mixed so that the concentration of the doping agent is in the range of, for example, 5 to 100% by weight, or preferably 10 to 50% by weight.

The dipping time of the suspension board with circuit 1 formed with the semiconductive layer 7 in the doping agent solution is set in the range of, for example, 30 seconds to 30 minutes, or preferably 1 to 10 minutes. The dipping temperature of the doping agent solution is set in the range of, for example, 10 to 70° C., or preferably 20 to 60° C.

The doping of the above-mentioned semiconductive layer 7 with the conductive polymer imparts conductivity to the conductive polymer.

Then, in this method, the suspension board with circuit 1 in a production process having the semiconductive layer 7 doped with the conductive polymer is further washed with water.

The semiconductive layer 7 made of the above-mentioned conductive polymer can be formed, according to the description of Japanese Unexamined Patent Publication No. 5-331431, Japanese Unexamined Patent Publication No. 9-207259, Japanese Unexamined Patent Publication No. 2003-124581, Japanese Unexamined Patent Publication No. 2003-203436, Japanese Unexamined Patent Publication No. 2003-204130, Japanese Unexamined Patent Publication No. 2004-158480, or the like.

In the method of applying a solution of a conductive polymer to the suspension board with circuit 1 and then drying a solvent thereof, for example, the solution of the conductive polymer is first prepared.

To prepare the solution of the conductive polymer, for example, a polymerization initiator solution is mixed with a monomer solution to polymerize a monomer therein, thereby obtaining a conductive polymer. Subsequently, the conductive polymer thus obtained is dissolved in a solvent to prepare a solution of the conductive polymer.

The monomer solution is prepared, for example, by mixing a monomer and a solvent. The same monomer as those described above is used as the monomer. The same solvent as that used in preparation of the above-mentioned polymeric liquid of the conductive polymer is used as the solvent. The same polymerization initiator solution as described above is used.

The concentration of monomers in the monomer solution is in the range of, for example, 0.001 to 1 mol/L, or preferably 0.01 to 0.1 mol/L. In the case where the solvent is an acidic aqueous solution, the concentration of acidic components is in the range of, for example, 0.001 to 1 mol/L, or preferably 0.01 to 0.1 mol/L. When the polymerization initiator is mixed with the monomer solution, the concentration of the polymerization initiator is in the range of, for example, 0.001 to 1 mol/L, or preferably 0.01 to 0.1 mol/L.

The conductive polymer is obtained by the polymerization of the above-mentioned monomer, and for example, the obtained powder is filtered off and then thoroughly washed, thereby obtaining a powder of the conductive polymer.

The solvent for preparing a solution of the conductive polymer is not particularly limited as long as the conductive polymer can be dissolved therein. Examples of the solvent include an organic solvent such as N-methyl-2-pyrrolidone (NMP), N,N-dimethylacetamide, N,N-dimethylformamide, dimethyl sulfoxide, 1,3-dimethyl-2-imidazolidinone, and sulfolane.

In the preparation of the solution of the conductive polymer, the solvent is mixed so that the concentration of the conductive polymer is in the range of, for example, 0.1 to 100 g/L.

Then, the prepared solution of the conductive polymer is applied to the suspension board with circuit 1 in a production process shown in FIG. 4(f) by a known application method, such as casting. Thereafter, the solvent therein is heated to dry at a temperature in the range of, for example, 50 to 200° C., or preferably 70 to 120° C., for example, for 1 to 60 minutes, or preferably for 1 to 10 minutes.

Accordingly, the semiconductive layer 7 made of the conductive polymer is formed so as to be deposited on the surface of the insulating base layer 3 exposed from the conductive pattern 4.

Thereafter, the suspension board with circuit 1 in a production process in which the semiconductive layer 7 is formed is washed with water.

Subsequently, in this method, the conductive polymer of the semiconductive layer 7 is doped as required. The same method as described above is used to dope the semiconductive layer 7. The doping of the semiconductive layer 7 with the conductive polymer as described above imparts conductivity to the conductive polymer.

Then, in this method, the suspension board with circuit 1 in a production process in which the semiconductive layer 7 doped with the conductive polymer is formed is further washed with water.

The semiconductive layer 7 made of the above-mentioned conductive polymer can be formed, according to the description of Japanese Unexamined Patent Publication No. 2002-275261 or the like.

The semiconductive resin composition contains, for example, an imide resin or an imide resin precursor, conductive particles, and a solvent.

As the imide resin, a known imide resin can be used, such as polyimide, polyether imide, and polyamide imide.

As the imide resin precursor, for example, an imide resin precursor described in Japanese Unexamined Patent Publication No. 2004-35825, can be used, such as a polyamic acid resin.

The conductive particles that may be used include, for example, conductive polymer particles, carbon particles, metal particles, and metal oxide particles.

The conductive polymer particles that may be used include particles of, such as polyaniline, polypyrrole, or polythiophene, or particles of a derivative thereof, or preferably polyaniline particles. The doping with the doping agent imparts polymer particles conductivity to the conductive polymer particles.

The same doping agent as described above is used. The doping may be performed by previously mixing conductive polymer particles with a solvent in which the conductive polymer particles are dispersed (dissolved). Alternatively, after the semiconductive layer 7 is formed, the suspension board with circuit 1 in a production process formed with the semiconductive layer 7 may be dipped in a solution of the doping agent.

The carbon particles that may be used include, for example, carbon black particles and carbon nanofibers.

The metal particles that may be used include, for example, particles of, such as chromium, nickel, copper, titanium, zirconium, indium, aluminum, or zinc.

The metal oxide particles that may be used include, for example, particles of, such as chromium oxide, nickel oxide, copper oxide, titanium oxide, zirconium oxide, indium oxide, aluminum oxide, or zinc oxide, or particles of a composite oxide thereof. More specifically, particles of, such as a composite oxide of indium oxide and tin oxide (ITO particles), or a composite oxide of tin oxide and phosphorus oxide (PTO particles), are used as the metal oxide particles.

These conductive particles can be used alone or in combination of two or more kinds. Preferably, ITO particles are used.

The conductive particle has an average particle size in the range of, for example, 10 nm to 1 μm, preferably 10 nm to 400 nm, or more preferably 10 nm to 100 nm. In the case where the conductive particle is composed of a carbon nanofiber, it has a diameter in the range of 100 to 200 nm, and a length in the range of 5 to 20 μm, for example. A smaller average particle size (diameter) of the conductive particle than this range may be difficult to adjust. Conversely, a larger average particle size (diameter) of the conductive particle than this range may not be suitable for coating.

The solvent that may be used is not particularly limited as long as the imide resin or the imide resin precursor, and the conductive particles can be dispersed (dissolved). Examples of the solvent include an aprotic polar solvent, such as N-methyl-2-pyrrolidone (NMP), N,N-dimethylacetamide, N,N-dimethylformamide, and dimethyl sulfoxide. These solvents can be used alone or in combination of two or more kinds.

The semiconductive resin composition can be prepared by mixing the imide resin or the imide resin precursor, the conductive particles, and the solvent, all described above.

The mixing ratio of the conductive particles is, for example, 1 to 300 parts by weight, or preferably 5 to 100 parts by weight based on 100 parts by weight of the imide resin or the imide resin precursor. A lower mixing ratio of the conductive particles than this range may result in insufficient conductivity. Conversely, a higher mixing ratio of the conductive particles than this range may impair the good coating property of the imide resin or the imide resin precursor.

The solvent is mixed such that a total volume of the imide resin or the imide resin precursor, and the conductive particles is in the range of, for example, 1 to 40% by weight (solids concentration), or preferably 5 to 30% by weight (solids concentration) based on the semiconductive resin composition. Either a lower or a higher solids concentration than the above range may cause difficulties in controlling to an intended coating thickness.

The semiconductive resin composition prepared above is uniformly coated all over the surface of the conductive pattern 4, the surface of the insulating base layer 3 exposed from the conductive pattern 4, and the surface of the metal supporting board 2 exposed from the insulating base layer 3 by a known coating method, such as roll coating method, gravure coating method, spin coating method, or bar coating method. Thereafter, the coated semiconductive resin composition is heated to dry at a temperature in the range of, for example, 60 to 250° C., or preferably 80 to 200° C., for example, for 1 to 30 minutes, or preferably for 3 to 15 minutes.

In the case where the semiconductive resin composition contains an imide resin precursor, the semiconductive resin composition is dried, and thereafter, heated at 250° C. or higher under reduced pressure to be cured (imidized).

Then, the semiconductive layer 7 thus formed on the surface of the metal supporting board 2 and the surface of the conductive pattern 4 is removed by etching or the like, so that the semiconductive layer 7 is formed in the above-mentioned pattern.

The semiconductive layer 7 can be formed of a metal, for example, by a method of sputtering a metal as a target and then oxidizing the metal by heat as required, a method of reactive sputtering, or a method of sputtering a metal oxide as a target. In the case where the conductive polymer is formed from a metal by the above-mentioned method, after the sputtering or the oxidation by heating, the semiconductive layer 7 formed on the surface of the conductive pattern 4 is removed by etching or the like so as to be formed on the surface of the insulating base layer 3 exposed from the conductive pattern 4.

Thus, the semiconductive layer 7 can be formed on the surface of the insulating base layer 3 exposed from the conductive pattern 4 so as to be in contact with and electrically connected to the conductive pattern 4 and the metal supporting board 2.

The surface resistance value of the semiconductive layer 7 thus formed is set in the range of, for example, $10^{14}$ to $10^{12}\Omega/\square$, or preferably $10^5$ to $10^{11}\Omega/\square$. A smaller surface resistance value of the semiconductive layer 7 than this range may cause malfunction of the electronic component mounted thereon. Conversely, a larger surface resistance value of the semiconductive layer 7 than this range may fail to prevent electrostatic breakdown.

Subsequently, in this method, as shown in FIG. 4(h), the insulating cover layer 5 in the wire forming region 19 is formed on the metal supporting board 2 exposed from the semiconductive layer 7, the conductive pattern 4, and the semiconductive layer 7, and the insulating cover layer 5 in the magnetic-head-side connecting terminal forming region 17 and the external connecting terminal forming region 18 is formed on the insulating base layer 3 so as to cover the wires 9 and so as to open the terminal portion 10.

As an insulator for forming the insulating cover layer 5, the same insulator as that used in the insulating base layer 3 is used. Preferably a photosensitive synthetic resin, or more preferably, a photosensitive polyimide is used.

To form the insulating cover layer 5 in the above-mentioned pattern, a varnish of photosensitive polyamic acid resin is uniformly coated over the metal supporting board 2, the conductive pattern 4, and the semiconductive layer 7 in the wire forming region 19, and over the conductive pattern 4 and the insulating base layer 3 in the magnetic-head-side connecting terminal forming region 17 and the external connecting terminal forming region 18, in the same method as described above. Subsequently, the coated varnish is dried as in the same manner as above to form a cover coating.

Thereafter, in the same method as described above, the cover coating is exposed to light via a photomask and is then heated at a given temperature as required. Thereafter, in the same method as described above, a portion where the insulating cover layer 5 is not formed is removed by development. Then, for example, the cover coating is heated at 250° C. or higher under reduced pressure to be cured (imidized). Thus, the insulating cover layer 5 is formed.

Accordingly, the insulating cover layer 5 is formed on the metal supporting board 2 exposed from the semiconductive layer 7, the conductive pattern 4, and the semiconductive layer 7 in the wire forming region 19, and formed on the insulating base layer 3 so as to cover the wires 9 and so as to open the terminal portion 10 in the magnetic-head-side connecting terminal forming region 17 and the external connecting terminal forming region 18.

Thereafter, in this method, a metal plating layer, not shown, is formed on the surface of the terminal portion 10, as required. Then, as shown in FIG. 1, the metal supporting board 2 is cut out by chemical etching to form a gimbal 8, and also trimmed to obtain the suspension board with circuit 1.

According to the suspension board with circuit 1, the semiconductive layer 7, that is, the first semiconductive layer 7a and the second semiconductive layer 7b have the second lower end portion 13 and the third lower end portion 14, respectively, both in contact with the metal supporting board 2 in the groove 6, and also have the first lower end portion 12 and the fourth lower end portion 35, respectively, both in contact with the metal supporting board 2 on the widthwise outer sides of the insulating base layer 3, that is, on widthwise one side surface of the first insulating base layer 3a and the widthwise other side surface of the second insulating base layer 3b.

This allows the semiconductive layer 7 to reliably ensure four portions for grounding on the metal supporting board 2. In such case, for example, even when an external force acts from the widthwise outer side of the suspension board with circuit 1, and the first lower end portion 12 and the fourth lower end portion 35 are then stripped off, grounding portions on the metal supporting board 2 can be reliably ensured by the second lower end portion 13 and the third lower end portion 14 in the groove 6.

Therefore, such grounding can provide stable charge attenuation performance, thereby allowing to reliably and stably remove static electricity charged on the conductive pattern 4. As a result, the electrostatic breakdown of the electronic components mounted on the suspension board with circuit 1 can be prevented, thereby improving the connection reliability of the suspension board with circuit 1.

Further, in the suspension board with circuit 1, one pair of the wires 9a and 9b and the other pair of the wires 9c and 9d are provided by pair on the first insulating base layer 3a and on the second insulating base layer 3b in the wire forming region 19, respectively. Therefore, static electricity charged on one pair of the wires 9a and 9b and on the other pair of the wires 9c and 9d can be reliably removed. As a result, the electrostatic breakdown of the electronic components mounted on the suspension board with circuit 1 can be prevented, thereby improving the connection reliability of the suspension board with circuit 1.

In the method for producing the suspension board with circuit 1 described above, when the semiconductive layer 7 is formed from a conductive polymer, the adhesion between the conductive polymer of the semiconductive layer 7 and the insulating base layer 3 (resin) is high, so that the semiconductive layer 7 can be reliably formed on the surface of the insulating base layer 3.

Further, in this case, no sputtering apparatus or the like is required for the formation of the semiconductive layer 7, so that the semiconductive layer 5 can be easily formed. Thus, the producing steps of the suspension board with circuit 1 can be simplified.

Figure 5:
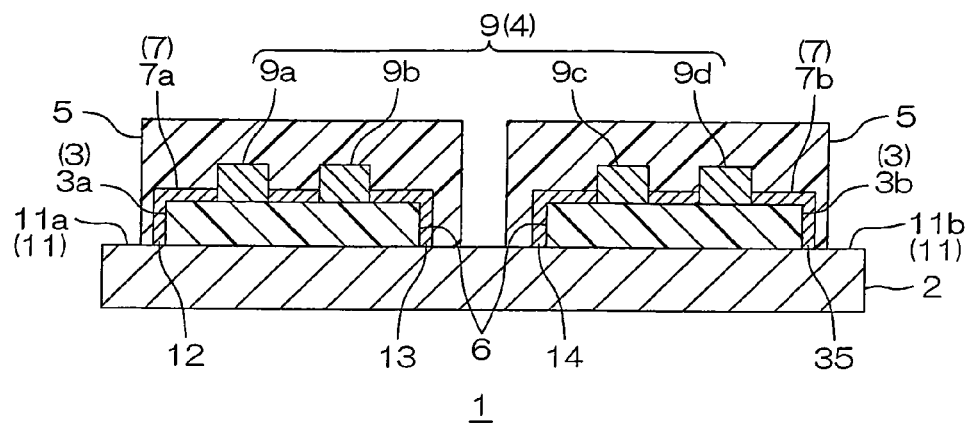
FIG. 5 is a sectional view in the widthwise direction of a suspension board with circuit as another embodiment of a wired circuit board according to the present invention.
Figure 6:
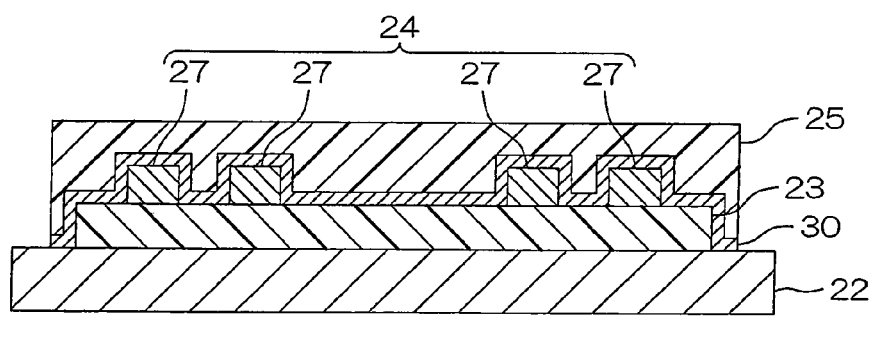
FIG. 6 is a sectional view in the widthwise direction of a suspension board with circuit (a mode without a groove).

FIG. 5 is a sectional view in the widthwise direction of a suspension board with circuit as another embodiment of a wired circuit board according to the present invention. The same reference numerals are provided in FIG. 5 for members corresponding to each of those described above, and their detailed description is omitted.

In the above explanation, the insulating cover layer 5 is continuously formed between the second lower end portion 13 and the third lower end portion 14 so as to cover the groove 6. However, for example, as shown in FIG. 5, the insulating cover layer 5 can be separately formed in the widthwise direction between the second lower end portion 13 and the third lower end portion 14 so that the widthwise midpoint of the groove 6 is exposed.

In the above explanation, two of the insulating base layers 3 provided with one pair of wires are formed, including the first insulating base layer 3a and the second insulating base layer 3b. However, the number thereof is not particularly limited, and for example, although not shown, three or more plurality of the insulating base layers 3 can be formed in spaced relation to each other in the widthwise direction. In this case, the semiconductive layer 7 can be formed on the surfaces of the respective insulating base layers 3 corresponding thereto.

EXAMPLE

While in the following, the present invention is described in further detail with reference to Example and Comparative Example, the present invention is not limited to any of them.

Example 1

A metal supporting board made of a 20 μm-thick stainless steel foil was prepared (cf. FIG. 3(a)).

Subsequently, a varnish of photosensitive polyamic acid resin was uniformly coated over a surface of the metal supporting board using a spin coater. The coated varnish was then heated at 90° C. for 15 minutes to form a base coating (cf. FIG. 3(b)). Thereafter, the base coating was exposed to light at 700 mJ/cm$^2$ via a photomask (cf. FIG. 3(c)), and then heated at 190° C. for 10 minutes. The base coating thus heated was developed using an alkaline developer (cf. FIG. 3(d)). Subsequently, the coating was cured at 385° C. under the pressure reduced to 1.33 Pa, thereby forming an insulating base layer of polyimide in a pattern including a first insulating base layer and a second insulating base layer in a wire forming region, corresponding to a portion where a conductive pattern was formed, and formed with a groove (cf. FIG. 3(e)). The first insulating base layer had a width of 240 μm, the second insulating base layer had a width of 520 μm, and the groove had a width of 50 μm. The insulating base layer thus formed had a thickness of 10 μm.

Next, a 10 μm-thick conductive pattern made of copper foil was formed by an additive method as a wired circuit pattern including a plurality of wires arranged in parallel spaced relation to each other and terminal portions each connected from the front end portion and the rear end portion of the respective wires (cf. FIG. 4(f). In the wire forming region, each of the wires had a width of 40 μm. Each of the spacing between the wires of one pair, and the spacing between the wires of the other pair was 25 μm. The spacing between the widthwise inner side wire of the wires in one pair and the widthwise inner side wire of the wires in the other pair was 150 μm.

Next, in the wire forming region, a semiconductive layer was formed on the surface of the insulating base layer exposed from the conductive pattern so as to be in contact with the conductive pattern and the metal supporting board (both the widthwise end portions of the metal supporting board and both the widthwise end portions in the groove).

To form the semiconductive layer, a polyaniline powder was first prepared.

To prepare the polyaniline powder, 6000 g of distilled water, 360 mL of 36% hydrochloric acid, and 400 g (4.295 mol) of aniline were mixed in a 10-liter separable flask equipped with a stirrer, a thermometer, and a straight tube adapter, and the mixture was then stirred therein to prepare a monomer solution of aniline. To the monomer solution of aniline, 1927 g (sulfuric acid: 4.295 mol) of 28% sulfuric acid aqueous solution was mixed with cooling. Then, 3273 g (ammonium peroxodisulfate: 4.295 mol) of 30% polymerization initiator solution was gradually added dropwise under stirring with cooling so that the monomer solution of aniline was kept at a temperature of −3° C. or lower. Thereafter, the added solution was stirred for another 1 hour so that the reaction solution was kept at a temperature of −3° C. or lower. Thus, a polyaniline powder was deposited.

Thereafter, the polyaniline powder was filtered off, and the resulting powder was washed with water and washed with acetone. The polyaniline powder was supplied in 4 L of 2N aqueous ammonia, and then stirred at a rotation speed of 5000 rpm for 5 hours using an autohomomixer. Thereafter, the polyaniline powder was filtered off and thoroughly washed with water and with acetone further to prepare a polyaniline powder.

Next, 10 g of the prepared polyaniline powder was dissolved in 90 g of NMP to prepare an NMP solution of polyaniline.

Next, the NMP solution of polyaniline was applied to the above-mentioned suspension board with circuit by casting.

Thereafter, the casted NMP solution was dried at 80° C. for 10 minutes to form a semiconductive layer made of polyaniline. Then, the suspension board with circuit formed with the semiconductive layer was dipped in an aqueous solution containing 20% by weight of p-phenolsulfonic acid novolac resin at 80° C. for 10 minutes to dope the semiconductive layer. Subsequently, the doped semiconductive layer was washed with water (cf. FIG. 4(g)). The doped semiconductive layer made of polyaniline had a thickness of 30 nm. When the surface resistance value of the doped semiconductive layer made of polyaniline was measured at a temperature of 25° C. and a humidity of 15% using a surface resistance measuring device (Hiresta-up MCP-HT450 available from Mitsubishi Chemical Corporation), the value was $1\times10^7 \Omega/\square$.

Next, the varnish of the photosensitive polyamic acid resin described above was uniformly coated over the metal supporting board, the conductive pattern, and the semiconductive layer in the wire forming region, and over the conductive pattern and the insulating base layer in a magnetic-head-side connecting terminal forming region and an external connecting terminal forming region using a spin coater. The coated varnish was then heated at 90° C. for 10 minutes to form a cover coating having a thickness of 7 μm. Thereafter, the cover coating was exposed to light at 700 mJ/cm$^2$ via a photomask, and then heated at 180° C. for 10 minutes. The cover coating was then developed using an alkaline developer to pattern the cover coating in a negative image. Subsequently, the cover coating was cured at 385° C. under the pressure reduced to 1.33 Pa. As a result of this, an insulating cover layer of polyimide was formed as a pattern on the metal supporting board exposed from the semiconductive layer the conductive pattern, and the semiconductive layer in the wire forming region, and on the insulating base layer in the magnetic-head-side connecting terminal forming region and the external connecting terminal forming region so as to cover the wires and open the terminal portion (cf. FIG. 4(h)). The insulating cover layer had a thickness of 5 μm.

Then, the metal plating layer was cut out by chemical etching to form a gimbal, and also trimmed to obtain the suspension board with circuit (cf. FIG. 1).

Comparative Example 1

The suspension board with circuit was obtained in the same method as Example 1 except that the groove was not formed during the formation of the insulating base layer.
(Evaluation)
Charge Attenuation Performance The suspension boards with circuit obtained in Example 1 and Comparative Example 1 were subjected to an external force from the widthwise outer side using a clean stick (HT-1950, available from Ishihara Sangyo Kaisha, Ltd.). Thereafter, charge attenuation performance of the suspension boards with circuit was evaluated using a nanocoulomb meter (commercially available from Kasuga Electric Works, Ltd.). The results showed that in the case of attenuating a charge of 0.1 nC (nanocoulomb), the suspension board with circuit of Example 1 had an attenuation time of 0.10 second and the standard deviation thereof was 0.01 while the suspension board with circuit of Comparative Example 1 had an attenuation time of 2.00 seconds and the standard deviation thereof was 0.50.

The suspension board with circuit of Example 1 was able to obtain more stable attenuation performance as compared with the suspension board with circuit of Comparative Example 1.

While the illustrative embodiments of the present invention are provided in the above description, such is for illustrative purpose only and it is not to be construed limitative. Modification and variation of the present invention that will be obvious to those skilled in the art is to be covered by the following claims.

What is claimed is:

1. A wired circuit board comprising:
a metal supporting board;
an insulating layer formed on the metal supporting board;
a conductive pattern formed on the insulating layer and having a plurality of wires; and
a semiconductive layer formed on a surface of the insulating layer exposed from the conductive pattern so as to be in contact with the conductive pattern,
wherein the insulating layer is formed with a groove exposing the metal supporting board between at least two adjacent wires among the wires,
such that a first insulating layer portion of the insulating layer is formed on one side of the groove and a second insulating layer portion of the insulating layer is formed on an opposite side of the groove,
wherein the semiconductive layer comprises a first semiconductive layer portion formed on the first insulating layer portion and in contact with one of the two adjacent wires, and a second semiconductive layer portion formed on the second insulating layer portion and in contact with another of the two adjacent wires, and
wherein the first semiconductive layer portion and the second semiconductive layer portion are each in contact with the metal supporting board in the groove.

2. The wired circuit board according to claim 1, wherein the semiconductive layer is made of a conductive polymer.

3. The wired circuit board according to claim 1, wherein the plurality of the wires are provided by pair on the respective first and second insulating layer portions of the insulating layer provided on opposite sides of the groove.

4. A method for producing a wired circuit board, comprising the steps of:
preparing a metal supporting board and forming an insulating layer on the metal supporting board so as to form a groove exposing the metal supporting board, such that a first insulating layer portion of the insulating layer is formed on one side of the groove and a second insulating portion of the insulating layer is formed on an opposite side of the groove;
forming a conductive pattern having a plurality of wires provided by pair on each of the first and second insulating layer portions, respectively, across the groove; and
forming a semiconductive layer on each of the first and second insulating layer portions exposed from the conductive pattern,
wherein the semiconductive layer comprises a first semiconductive layer portion formed on the first insulating layer portion and in contact with one pair of the wires, and a second semiconductive layer portion formed on the second insulating layer portion and in contact with the other pair of wires, and wherein the first semiconductive layer portion and the second semiconductive layer portion are each in contact with the metal supporting board in the groove.

5. The method for producing the wired circuit board according to claim 4, wherein the semiconductive layer is formed of a conductive polymer in the step of forming the semiconductive layer.

6. The wired circuit board according to claim 1, further comprising an insulating cover layer which is continuously formed in the groove between a position where the first semiconductive layer portion and the second semiconductive layer portion contact the metal supporting board.

7. The wired circuit board according to claim 6, wherein the insulating cover layer is formed as separate portions in a widthwise direction, such that the metal supporting board is exposed in the groove between the first semiconductive layer portion and the second semiconductive layer portion.

* * * * *